(12) United States Patent
Jin et al.

(10) Patent No.: US 11,462,628 B2
(45) Date of Patent: Oct. 4, 2022

(54) SEMICONDUCTOR DEVICE, AND MANUFACTURING METHOD THEREOF

(71) Applicant: CSMC TECHNOLOGIES FAB2 CO., LTD., Jiangsu (CN)

(72) Inventors: Huajun Jin, Wuxi (CN); Guipeng Sun, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 129 days.

(21) Appl. No.: 16/771,168

(22) PCT Filed: Nov. 13, 2018

(86) PCT No.: PCT/CN2018/115202
§ 371 (c)(1),
(2) Date: Jun. 9, 2020

(87) PCT Pub. No.: WO2019/128500
PCT Pub. Date: Jul. 4, 2019

(65) Prior Publication Data
US 2021/0167190 A1    Jun. 3, 2021

(30) Foreign Application Priority Data
Dec. 28, 2017    (CN) .......................... 201711465436.8

(51) Int. Cl.
*H01L 31/062*    (2012.01)
*H01L 29/76*    (2006.01)
(Continued)

(52) U.S. Cl.
CPC ...... *H01L 29/66681* (2013.01); *H01L 29/404* (2013.01); *H01L 29/665* (2013.01); *H01L 29/7816* (2013.01)

(58) Field of Classification Search
CPC ............. H01L 29/66681; H01L 29/404; H01L 29/665; H01L 29/7816; H01L 29/42368;
(Continued)

(56) References Cited

U.S. PATENT DOCUMENTS 5,387,535 A * 2/1995 Wilmsmeyer .... H01L 21/76895
438/586
6,559,011 B1 * 5/2003 Shibib ................. H01L 29/7835
257/329
(Continued)

FOREIGN PATENT DOCUMENTS

| CN | 101771081 | 7/2010 |
| CN | 103928514 | 7/2014 |
| CN | 107230637 | 10/2017 |

OTHER PUBLICATIONS

International Search Report issued for International Patent Application No. PCT/CN2018/115202, dated Feb. 3, 2019, 5 pages including English translation.

*Primary Examiner* — Theresa T Doan
(74) *Attorney, Agent, or Firm* — Hamre, Schumann, Mueller & Larson, P.C.

(57) ABSTRACT

A semiconductor device, and a manufacturing method thereof. The method includes: providing a semiconductor substrate provided with a body region, a gate dielectric layer, and a field oxide layer, formed on the semiconductor substrate; forming a gate polycrystalline, the gate polycrystalline covering the gate dielectric layer and the field oxide layer and exposing at least one portion of the field oxide layer; forming a drift region in the semiconductor substrate by ion implantation using a drift region masking layer as a mask, removing the exposed portion of the field oxide layer by further using the drift region masking layer as the mask to form a first field oxide self-aligned with the gate polycrystalline; forming a source region in the body region, and (Continued)

forming a drain region in the drift region; forming a second field oxide on the semiconductor substrate; and forming a second field plate on the second field oxide.

11 Claims, 4 Drawing Sheets

(51) Int. Cl.
*H01L 29/66* (2006.01)
*H01L 29/40* (2006.01)
*H01L 29/78* (2006.01)

(58) Field of Classification Search
CPC ............ H01L 29/4933; H01L 29/1045; H01L 29/66659; H01L 29/7835
USPC .......................................................... 257/288
See application file for complete search history.

(56) References Cited

U.S. PATENT DOCUMENTS

| | | |
|---|---|---|
| 2011/0115007 A1 | 5/2011 | Wahl et al. |
| 2014/0131796 A1* | 5/2014 | Zhou ................ H01L 29/66681 438/286 |

* cited by examiner

SEMICONDUCTOR DEVICE, AND MANUFACTURING METHOD THEREOF

CROSS REFERENCE TO RELATED APPLICATIONS

This application claims priority to Chinese patent application No. 201711465436.8, entitled "SEMICONDUCTOR DEVICE, AND MANUFACTURING METHOD THEREOF", and filed on Dec. 28, 2017, the content of which is herein incorporated in its entirety by reference.

TECHNICAL FIELD

The present disclosure relates to the field of semiconductor technologies, and particularly to a semiconductor device and a manufacturing method thereof.

BACKGROUND

With the continuous development of semiconductor technologies, Lateral Double Diffused Metal Oxide Semiconductor Field-Effect Transistor (LDMOS) devices are widely used due to their properties of well-performing short-channels. LDMOS, as a power switching device, has the characteristics of a relatively high working voltage, a simple process, easiness in process compatibility with a low-voltage Complementary Metal Oxide Semiconductor (CMOS) circuit, and the like. In comparison with common (Metal Oxide Semiconductor) MOS devices, there is a lightly doped implanted region at the drain, which is referred to a drift region. Since the drift region is usually used in power circuits and needs a relatively high output power, it must be able to withstand a relatively high breakdown voltage.

In the conventional technology, a layer of metal field plate is formed in the drift region to enhance the depletion of the drift region, but only one-level field plate is provided to enhance the depletion of the drift region, so that the depletion of the drift region is still insufficient, and a device having a high-level breakdown voltage cannot be provided. Furthermore, this scheme has a relatively limited optimization of the electric field at the gate polycrystalline boundary, which results in the breakdown voltage being limited on the boundary of the gate.

SUMMARY

Accordingly, it is necessary to provide a semiconductor device and a manufacturing method thereof.

A series of concepts in a simplified form are introduced in the summary section, which is described in further detail in the detailed description of the embodiments section. The summary of the present disclosure is not intended to define substantial features and essential technical features of the claimed technical solutions, nor is it intended to determine the scope of the claimed technical solutions.

A method of manufacturing a semiconductor device is provided, including the following steps of:

providing a semiconductor substrate provided with a body region, a gate dielectric layer, and a field oxide layer;

forming a gate polycrystalline, the gate polycrystalline covering the gate dielectric layer and the field oxide layer, and exposing at least a portion of the field oxide layer;

forming a drift region in the semiconductor substrate by ion implantation using a drift region masking layer as a mask, removing the exposed portion of the field oxide layer by further using the drift region masking layer as the mask to form a first field oxide self-aligned with the gate polycrystalline, the gate polycrystalline being configured as a first field plate;

forming a source region in the body region and forming a drain region in the drift region;

forming a second field oxide on the semiconductor substrate; and forming a second field plate on the second field oxide.

Details of one or more embodiments of the present disclosure are set forth in the accompanying drawings and description below. Other features, objects, and advantages of the present disclosure will become thorough from the description, the drawings, and the claims.

The present disclosure further provides a semiconductor device, including:

a semiconductor substrate provided with a body region and a drift region, a source region being located in the body region, and a drain region being located in the drift region;

a gate dielectric layer located on the semiconductor substrate;

a first field oxide located on the semiconductor substrate;

a gate polycrystalline covering the first field oxide and the gate dielectric layer, the gate polycrystalline being configured as a first field plate;

a second field oxide covering the semiconductor substrate; and a second field plate located on the second field oxide.

BRIEF DESCRIPTION OF THE DRAWINGS

By describing the embodiments of the present disclosure in more details with reference to the drawings, the above and other objects, features, and advantages of the present disclosure will become more thorough. The drawings are used for further understanding of the embodiments of the present disclosure, and constitute a part of the specification, which are used to illustrate the present disclosure together with reference to the embodiments of the present disclosure, rather than to constitute a limitation of the present disclosure. In the drawings, the same reference numerals generally represent the same components or steps.

In order to illustrate the technical solutions in the embodiments of the present disclosure more clearly, the drawings used in the description of the embodiments will be briefly introduced below. Apparently, the drawings in the following description are merely some embodiments of the present disclosure. For those skilled in the art, drawings of other embodiments can be obtained based on these drawings, without any creative efforts.

DETAILED DESCRIPTION OF THE EMBODIMENTS

Figure 1:
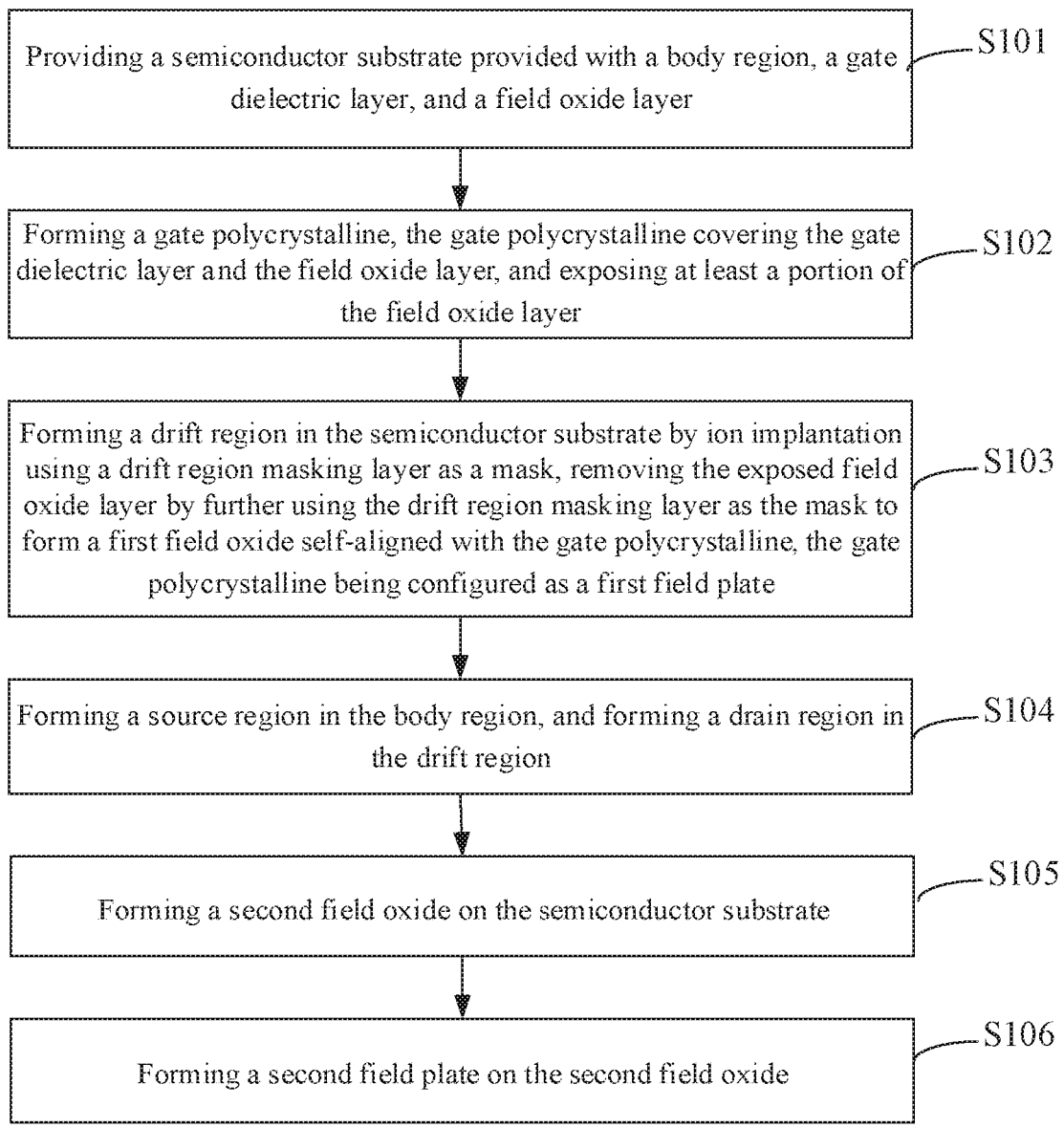
FIG. 1 is a flow chart illustrating a method of manufacturing a semiconductor device in accordance with an exemplary embodiment of the present disclosure.

In order to make the objects, technical solutions, and advantages of the disclosure clearer, the present disclosure will be described in detail with reference to the accompanying drawings and embodiments. It should be understood, the specific embodiments described herein are merely used to illustrate the disclosure, rather than to limit the present disclosure.

In the following description, a plenty of specific details are provided for a more thorough understanding of the present disclosure. However, it will be understood to those skilled in the art that the present disclosure can be implemented without one or more of these details. In other examples, in order to avoid confusion with the present disclosure, some technical features known in the art are not described.

It should be understood that the present disclosure can be implemented in different forms and should not be construed as being limited to the embodiments set forth herein. Rather, the provision of these embodiments can make this disclosure more thorough and complete, and will fully impart the scope of the disclosure to those skilled in the art. In the drawings, the sizes and relative sizes of layers and regions can be exaggerated for clarity. The same reference numerals refer to the same elements through the specification.

It should be understood that when an element or layer is referred to as being "arranged on", "adjacent to", "connected to" or "coupled to" another element or layer, it can be construed as being directly, or through an intervening element or layer, arranged on, adjacent to, connected to or coupled to the other element or layer. In contrast, when an element or layer is referred to as being "directly arranged on", "directly adjacent to", "directly connected to" or "directly coupled to" another element or layer, an intervening element or layer doesn't exist. It should be understood that, although the terms of first, second, third, or the like may be used to describe various elements, components, regions, layers and/or portions, these elements, components, regions, layers and/or portions should not be limited by these terms. These terms are merely used to distinguish an element, component, region, layer, or portion from another element, component, region, layer, or portion. Therefore, the first element, component, region, layer, or portion described below could also be indicated by the second element, component, region, layer, or portion, without departing from the teaching of the present disclosure.

Spatial orientation terms, such as "under", "beneath", "below", "underneath", "on", "above", and the like, can be used herein for facilitating the description, thereby indicating the relationship between one element or feature and another element or feature shown in the figure. It should be understood that the spatial orientation terms are also intended to include different orientations for the usage and operation of the device other than the orientations shown in the figures. For example, if the device in the figures is reversed, an element or feature described as "beneath", "under", or "below" another element or feature would be oriented as "above" the other element or feature. Therefore, the exemplary terms of "beneath" or "under" can include two orientations of up and down. The device may be otherwise oriented (rotated by 90 degrees or otherwise orientated), and the spatial languages used herein will be interpreted accordingly.

The purpose of the terms used herein is merely to describe the specific embodiments, rather than to limit the present disclosure. As used herein, the singular forms of "a(n)", "one" and "the" are also intended to include the plural forms as well, unless otherwise specifically defined in the context. It should also be understood that the terms of "being consisted of" and/or "including/comprising", when used in this specification, determine the presence of features, integers, steps, operations, elements and/or components, but do not exclude one or more of the presence or addition of features, integers, steps, operations, elements, components and/or groups. As used herein, the term "and/or" includes any and all combinations of the associated listed items.

In order to thoroughly understand the present disclosure, detailed steps and detailed structures will be set forth in the following description, so as to illustrate the technical solutions proposed by the present disclosure. The preferred embodiments of the present disclosure are described in detail below. However, the present disclosure may have other implementations other than these detailed descriptions.

Lateral Double Diffused Metal Oxide Semiconductor Field-Effect Transistor (LDMOS), as a power switching device, has the characteristics of a relatively high working voltage, a simple process, easiness in process compatibility with a low-voltage Complementary Metal Oxide Semiconductor (CMOS) circuit, and the like. In comparison with common (Metal Oxide Semiconductor) MOS devices, there is a lightly doped implanted region at the drain, which is referred to a drift region. Since the drift region is usually used in power circuits and needs a relatively high output power, it must be able to withstand a relatively high breakdown voltage.

In the conventional technology, one-level field plate is formed in the drift region to enhance the depletion of the drift region, but only one-level field plate is provided to enhance the depletion of the drift region, so that the depletion of the drift region is still insufficient, and a device having a high-level breakdown voltage cannot be provided. In addition, this scheme has a relatively limited optimization of the electric field at the gate polycrystalline boundary, which results in the breakdown voltage being limited on the boundary of the gate.

In view of the deficiencies of the conventional technologies, the present disclosure provides a method of manufacturing a semiconductor device, including:

providing a semiconductor substrate provided with a body region, a gate dielectric layer, and a field oxide layer;

forming a gate polycrystalline, the gate polycrystalline covering the gate dielectric layer and the field oxide layer, and exposing at least a portion of the field oxide layer;

forming a drift region in the semiconductor substrate by ion implantation using a drift region masking layer as a mask, removing the exposed portion of the field oxide layer by further using the drift region masking layer as the mask to form a first field oxide self-aligned with the gate polycrystalline, the gate polycrystalline being used as a first field plate;

forming a source region in the body region and forming a drain region in the drift region;

forming a second field oxide on the semiconductor substrate; and forming a second field plate on the second field oxide.

Between the step of forming the source region in the body region and forming the drain region in the drift region, and the step of forming the second field oxide on the semiconductor substrate, the method further includes: forming a salicide block layer disposed across the drift region and the gate polycrystalline; and forming a metal silicide on an exposed upper surface of the gate polycrystalline, the source region, and the drain region. The step of forming the second field plate on the second field oxide specifically includes: forming a metal layer covering the second field oxide; and forming the second field plate on the second field oxide and above the salicide block layer by lithography and etching. The second field plate is located above the gate polycrystalline and/or the drift region.

According to the method of manufacturing the semiconductor device provided by the present disclosure, the first field plate is formed on the first field oxide and located above the drift region, and the second field plate is formed on the second field oxide, so that the two-level field plates enhance the depletion of the drift region while improving the electric field at the gate boundary, thereby increasing the breakdown voltage of the device.

Referring to FIG. 1 and FIGS. 2A to 2H, FIG. 1 shows a flow chart of a method of manufacturing a semiconductor device according to an exemplary embodiment of the present disclosure, and FIGS. 2A to 2H show sectional views of devices respectively obtained by steps sequentially performed according to the method of the exemplary embodiment of the present disclosure.

The present disclosure provides the method of manufacturing the semiconductor device, as shown in FIG. 1, the manufacturing method substantially includes the following steps.

At step S101, a semiconductor substrate provided with a body region, a gate dielectric layer, and a field oxide layer is provided.

At step S102, a gate polycrystalline is formed. The gate polycrystalline covers the gate dielectric layer and the field oxide layer, and exposes at least a portion of the field oxide layer.

At step S103, a drift region is formed in the semiconductor substrate by ion implantation using a drift region masking layer as a mask, the exposed portion of the field oxide layer is removed by further using the drift region masking layer as the mask so as to form a first field oxide self-aligned with the gate polycrystalline. The gate polycrystalline is used as a first field plate.

At step S104, a source region is formed in the body region, and a drain region is formed in the drift region.

At step S105, a second field oxide is formed on the semiconductor substrate.

At step S106, a second field plate is formed on the second field oxide.

According to embodiments of the present disclosure, the method of manufacturing the semiconductor device of the present disclosure specifically includes the following steps.

Figure 2A:
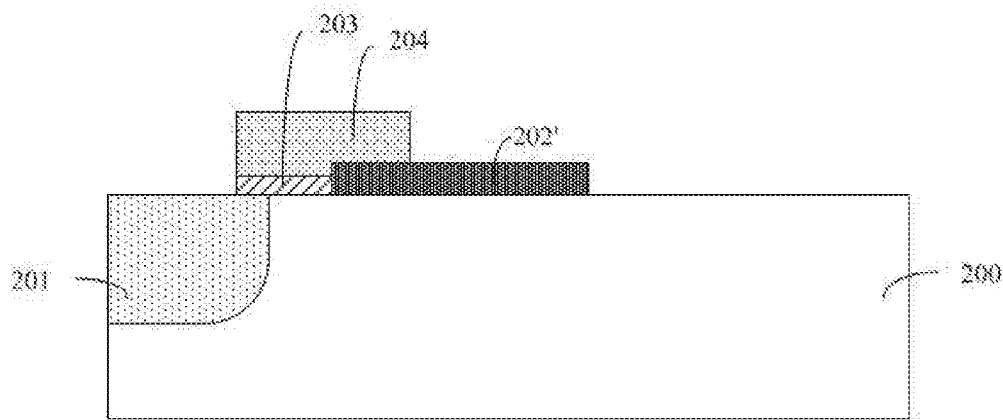
FIGS. 2A to 2H are sectional views illustrating devices respectively obtained by steps sequentially performed in accordance with a method of an exemplary embodiment of the present disclosure.

Firstly, step S101 is performed to obtain a device structure shown in FIG. 2A. The semiconductor substrate 200 is provided in which the body region 201, the gate dielectric layer 203, and the field oxide layer 202' are formed.

In an embodiment, the semiconductor device includes a LDMOS device.

In an embodiment, the semiconductor substrate 200 can be at least one of the following materials: monocrystalline silicon, silicon on insulator (SOI), stacked silicon on insulator (SSOI), stacked silicon germanium on insulator (S—SiGeOI), silicon germanium on insulator (SiGeOI), germanium on insulator (GeOI), and the like. In this embodiment, the semiconductor substrate 200 is a P-type silicon substrate (P-sub), of which specific doping concentration is not limited to the present disclosure. The semiconductor substrate 200 can be formed by an epitaxial growth, or can also be a wafer substrate.

In an embodiment, a P-well is formed in the semiconductor substrate 200, and is used as the body region (Body) 201. As an example, a P-well is formed in the semiconductor substrate by using a standard well implantation process, and the P-well can be formed by a high-energy implantation process, or can also be formed by a low-energy implantation process in combination with a high-temperature thermal annealing process. In an embodiment, a doping concentration of the body region 201 can range from $10^{15}$ atoms/cm$^3$ to $10^{18}$ atoms/cm$^3$. For example, the doping concentration is configured to $10^{17}$ atoms/cm$^3$.

In an embodiment, the material of the field oxide layer 202' is silicon oxide. The field oxide layer 202' can be formed by any method known to those skilled in the art. As an example, the field oxide layer 202' is formed by patterning and oxidation using a Local Oxidation of Silicon (LOCOS) process. Specifically, the steps of the process include: growing a silicon dioxide buffer layer on a surface of the semiconductor substrate, forming a hard mask layer on the buffer layer, etching the hard mask layer and the buffer layer to expose an isolation region, and thermally oxidizing to form the field oxide layer 202'.

In an embodiment, a gate dielectric layer 203 is formed on the semiconductor substrate 200. The gate dielectric layer 203 includes an oxide layer, for example, a silicon dioxide (SiO$_2$) layer having a thickness ranging from 100 Å to 150 Å. As shown in FIG. 2A, one end of the gate dielectric layer 203 covers a portion of the body region 201.

Next, step S102 is performed to obtain the device structure shown in FIG. 2A. A gate polycrystalline 204 is formed. The gate polycrystalline 204 covers the gate dielectric layer 203 and the field oxide layer 202', and exposes at least a portion of the field oxide layer 202'.

In an embodiment, the gate polycrystalline 204 is formed on the semiconductor substrate 200, and the gate polycrystalline 204 includes polysilicon. As shown in FIG. 2A, the gate polycrystalline 204 covers the gate dielectric layer 203 and the field oxide layer 202', and exposes at least a portion of the field oxide layer 202'.

Figure 2B:
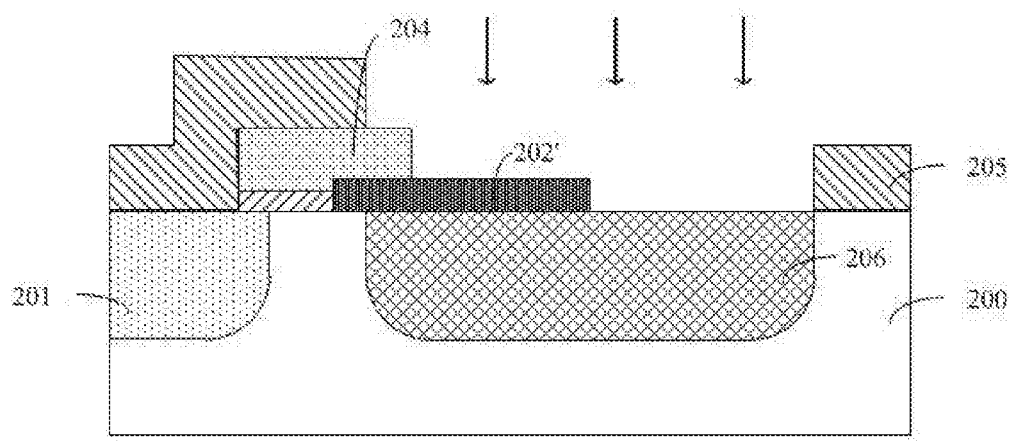

Next, step S103 is performed to obtain a device structure shown in FIG. 2B. A drift region 206 is formed in the semiconductor substrate 200 by ion implantation using a drift region masking layer 205 as a mask. The exposed portion of the field oxide layer 202' is removed by further using the drift region masking layer 205 as the mask so as to form a first field oxide 202 self-aligned with the gate polycrystalline 204. The gate polycrystalline 204 is used as a first field plate.

In an embodiment, a drift region (Drift) 206 is formed in the semiconductor substrate 200. The drift region 206 is located in the semiconductor substrate 200, and usually is a lightly doped region. For the LDMOS with an N-trench, the drift region is N-type doped. As an example, the drift region masking layer 205 is firstly formed on the semiconductor substrate 200. Specifically, the drift region masking layer 205 is a photoresist layer. Then, an opening pattern is formed in the photoresists by exposure and development processes. Next, the drift region 206 is formed within the opening region by a high-energy implantation process, or by a low-energy implantation process in combination with a high-temperature thermal annealing process. In an embodiment, a doping concentration of the drift region 206 can range from $10^{15}$ atoms/cm$^3$ to $10^{18}$ atoms/cm$^3$.

Figure 2C:
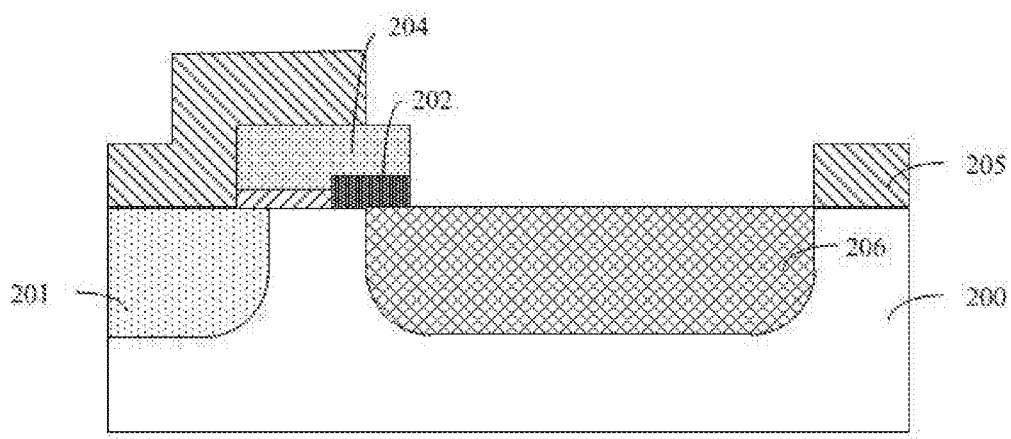

In an embodiment, the field oxide layer 202' is etched by further using the drift region masking layer 205 as the mask, thereby removing the field oxide layer 202' outside of the gate polycrystalline 204 to form the first field oxide 202. Then, the photoresist layer is removed. As shown in FIG. 2C, the first field oxide 202 is located above the drift region 206. The formation of the first field oxide 202 improves the electric field at the boundary of the gate polycrystalline while optimizing the depletion of the drift region 206, thereby increasing the breakdown voltage of the device.

According to the above-mentioned method, the field oxide layer 202' is etched by using the drift region masking layer 205 for forming the drift region 206 as the mask. Since the gate polycrystalline 204, other than the masking of the drift region masking layer 205, also has the blocking ability for the field oxide layer 202' under the gate polycrystalline 204, an edge of the first field oxide 202 is flush with the gate polycrystalline 204 after the field oxide layer 202' is etched, so that the first field oxide 202 self-aligned with the gate polycrystalline 204 is formed. The gate polycrystalline 204 above the first field oxide 202 is used as the first field plate, so that the size of the drain terminal is reduced, and the on-resistance of the device is optimized. In addition, in the conventional technology, a lithography process is usually performed on the first field oxide before the drift region is formed, so that a corresponding lithography mask is required to be added, while the method used in the present disclosure does not need to add a lithography mask, thereby saving the cost.

Figure 2D:
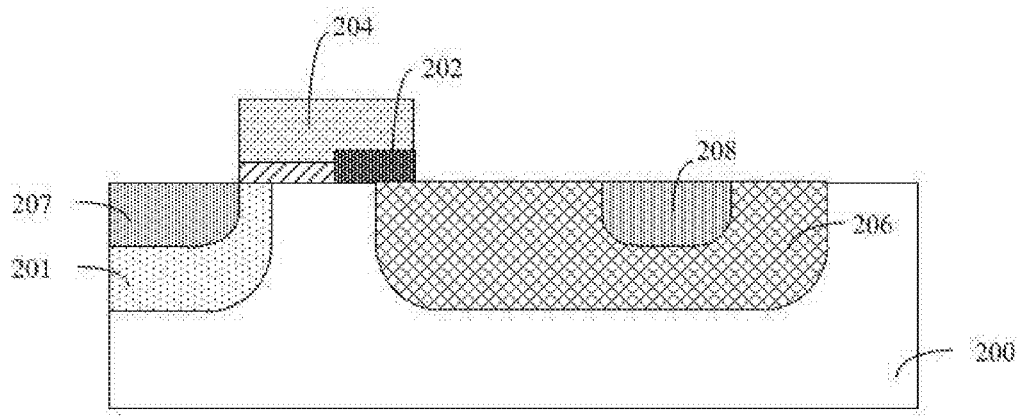

Next, step S104 is performed to obtain a device structure shown in FIG. 2D. A source region 207 is formed in the body region 201, and a drain region 208 is formed in the drift region 206.

In an embodiment, the source region (source) 207 is formed in the body region 201, and the drain region (drain) 208 is included in the drift region 206. A source electrode and a drain electrode can be respectively led out from the source region 207 and the drain region 208. As an example, the source region 207 is formed by implanting N-type dopants into the body region 201 and the drain region 208 is formed by implanting N-type dopants into the drift region 206. The doping concentrations of the source region 207 and the drain region 208 can be the same. Therefore, the source region 207 and the drain region 208 can be formed by doping simultaneously. In an embodiment, the N-type doping concentration of the source region 207 and the drain region 208 can range from $10^{18}$ atoms/cm$^3$ to $10^{21}$ atoms/cm$^3$. For example, the doping concentration is configured to $10^{20}$ atoms/cm$^3$.

Figure 2E:
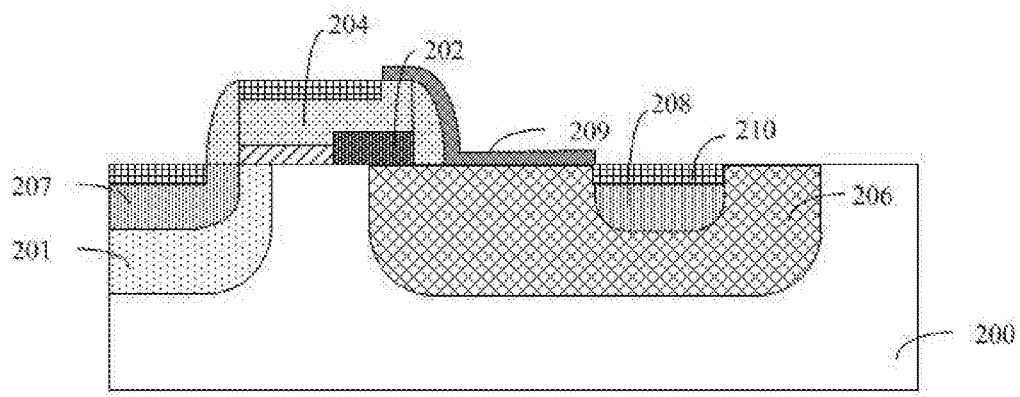

Next, as shown in FIG. 2E, a salicide block (SAB) layer 209 is formed across the drift region 206 and the gate polycrystalline 204. An edge of the salicide block layer 209 is adjacent to an edge of the drain region 208.

In an embodiment, a salicide block layer is firstly deposited to completely cover the surface of the device formed by the above steps. In an embodiment, the SAB layer is an oxide layer. Next, an upper surface of the SAB layer is coated with a layer of photoresists. Then, an opening pattern is formed in the photoresists by exposure and development processes. Then, the residual photoresists are used as a mask to perform dry etching downwards, and the SAB layer positioned below the opening of the photoresists is removed. Lastly, the residual photoresists are removed. The salicide block layer 209 is eventually formed across the drift region 206 and the gate polycrystalline 204 as shown in FIG. 2E. The salicide block layer 209 has a thickness ranging from 300 Å to 2000 Å. The salicide block layer 209 completely covers the drift region 206, and has an overlapping length with the gate polycrystalline of 0.15 µm to 0.25 µm. In other embodiments, the salicide block layer 209 completely covers the drift region 206, and has an overlapping length with the gate structure of 0.2 µm. The formation of the salicide block layer 209 can increase the distance between the drain terminal and the gate polycrystalline 204, thereby further increasing the breakdown voltage of the device. In other embodiments, the salicide block layer 209 may not be formed on the drift region 206 and the gate polycrystalline 204.

Next, as shown in FIG. 2E, a metal silicide 210 is formed on an exposed upper surface of the gate polycrystalline 204, the source region 207, and the drain region 208. The formed metal silicide 210 can reduce a contact resistance of the device, thereby reducing the power consumption of the device. In an embodiment, a metal layer is firstly deposited so as to completely cover the device formed by the above-mentioned steps. The metal layer can be made of any one of the following materials: cobalt, titanium, aluminum, gold, molybdenum, silicon cobaltate, silicon titanate, and silicon palladium. In an embodiment, the material of the metal layer is cobalt. Next, a rapid thermal annealing (RTA) is performed so that the deposited metal layer reacts with the contacted polysilicon, thereby further forming a metal silicide 210 on the exposed upper surface of the gate electrode, the source region 207, and the drain region 208. Next, the unreacted metal layer is completely removed by using an etching process. In other embodiments, the metal silicide 208 may not be formed.

Figure 2F:
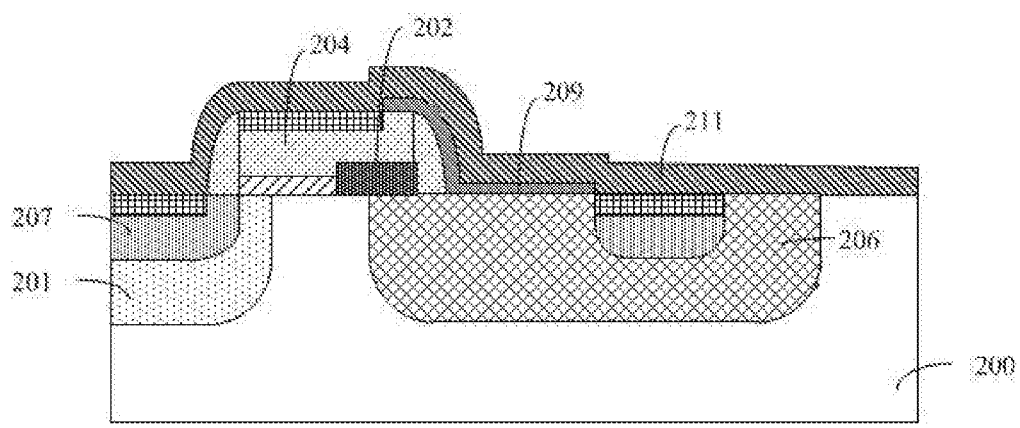

Next, step S105 is performed to obtain a device structure shown in FIG. 2F. A second field oxide 211 is formed on the semiconductor substrate 200.

In an embodiment, a layer of a second field oxide 211 is deposited so as to completely cover the device formed by the above-mentioned steps, as shown in FIG. 2F. As an example, the second field oxide 211 is an oxide layer. In this embodiment, a thickness of the second field oxide 211 can be correspondingly configured according to performance requirements of the device. Specifically, the thickness of the second field oxide 211 can be adjusted according to the device properties. For example, the reduction of the thickness of the second field oxide 211 can enhance the depletion of the drift region 206, and the increase of the thickness of the second field oxide 211 can weaken the depletion of the drift region 206.

In this embodiment, the second field oxide having an adjustable thickness is formed between the salicide block layer and the subsequently formed second field plate. This avoids the problem that the enhancement of the depletion effect of the second field plate on the underlying drift region is limited due to the fixed thickness of the salicide block layer, the depletion of the drift region by the second field plate cannot be changed by changing the thickness of the second field oxide under the second field plate, and further the device properties show a lower breakdown voltage caused by the too fast depletion or insufficient depletion of the drift region. The thickness of the second field oxide under the second field plate of the present disclosure is adjustable, so that the adjustment to the device properties can be more flexible.

Figure 2G:
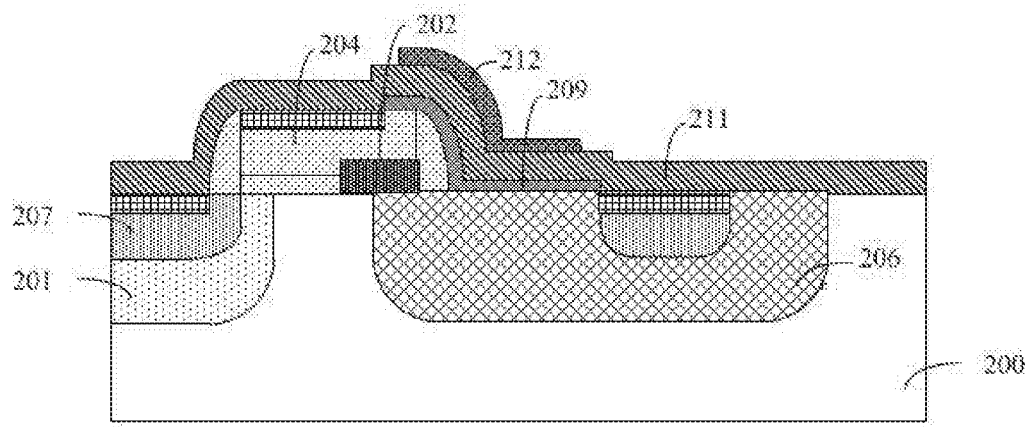

Next, the second field plate 212 is formed on the second field oxide 211 by performing the step S106 so as to obtain a device structure shown in FIG. 2G In this embodiment, the second field plate 212 is a metal field plate. In other embodiments, the second field plate 212 can be a polycrystalline field plate.

In an embodiment, the second field plate 212 is the metal field plate. Forming the second field plate 212 includes the following steps. Firstly, a metal layer is deposited so as to completely cover the device formed by the above-mentioned steps. The metal layer can be made of any one of the following materials: cobalt, titanium, aluminum, gold, molybdenum, silicon cobaltate, silicon titanate, and silicon palladium. In an embodiment, the material of the metal layer is cobalt. Next, an upper surface of the metal layer is coated with a layer of photoresists, and then, an opening pattern is formed in the photoresists by exposure and development processes. Then, the residual photoresists are used as a mask to perform dry etching downwards, and the metal layer under the opening of the photoresists is removed, so as to form the second field plate 212. Lastly, the residual photoresists are removed. The second field plate 212 across the drift region 206 and the gate polycrystalline 204 is eventually formed as shown in FIG. 2G. The second field plate 212 is located on the second field oxide 211 and above the salicide block layer 209, and a coverage of the second field plate 212 is less than or equal to a coverage of the salicide block layer 209. In an embodiment, a left boundary of the second field plate 212 is in line with a left boundary of the salicide block layer 209, and a range of a right boundary of the second field plate 212 is less than a range of a right boundary of the salicide block layer 209. In another embodiment, for the device having a smaller size of the drift region, the left boundary of the second field plate 212 cannot extend above the gate polycrystalline, and the second field plate 212 is located on the second field oxide 211 and only above the drift region. The range of the right boundary of the second field plate 212 is less than the range of the right boundary of the salicide block layer 209. The formation of the second field plate 212 enhances the depletion of the drift region 206 between the drain region 208 and the gate polycrystalline, thereby effectively increasing the breakdown voltage of the device.

Figure 2H:
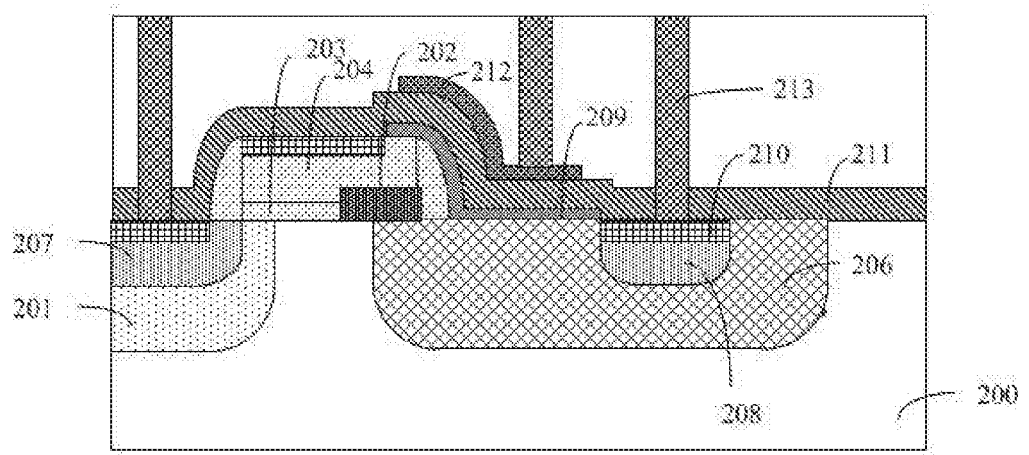

Next, a step of forming an interlayer dielectric layer and a contact hole 213 extending through the interlayer dielectric layer is further included after the formation of the second field plate 212, as shown in FIG. 2H.

In an embodiment, as shown in FIG. 2H, a contact hole 213 is respectively provided above the source region 207, the drain region 208, and the second field plate 212, and the contact holes 213 are filled with metal (for example, copper). The contact hole 213 leads the second field plate 212 to ground.

The structure of the semiconductor device provided by the embodiment of the present disclosure is illustrated below with reference to FIG. 2H. The semiconductor device includes a semiconductor substrate 200, in which a body region 201 and a drift region 206 are formed. A source region 207 is located in the body region 201, and a drain region 208 is located in the drift region 206. A first field oxide 202, a gate dielectric layer 203, and a gate polycrystalline 204 are formed on the semiconductor substrate 200. The gate polycrystalline 204 covers the gate dielectric layer 203 and the first field oxide 202. The gate polycrystalline 204 is used as the first field plate. The second field oxide 211 covers the semiconductor substrate 200. The second field plate 212 is located on the second field oxide 211.

In an embodiment, the semiconductor device includes a LDMOS device.

In an embodiment, the semiconductor substrate 200 can be at least one of the following materials: monocrystalline silicon, silicon on insulator (SOI), stacked silicon on insulator (SSOI), stacked silicon germanium on insulator (S—SiGeOI), silicon germanium on insulator (SiGeOI), germanium on insulator (GeOI), and the like. In this embodiment, the semiconductor substrate 200 is a P-type silicon substrate (P-sub), of which doping concentration is not limited to the present disclosure. The semiconductor substrate 200 can be formed by an epitaxial growth, or can also be a wafer substrate.

In an embodiment, a P-well is formed in the semiconductor substrate 200, and is used as the body region (Body) 201. In an embodiment, the doping concentration of the body region 201 can range from $10^{15}$ atoms/cm$^3$ to $10^{18}$ atoms/cm$^3$. For example, the doping concentration is configured to $10^{17}$ atoms/cm$^3$. The drift region (Drift) 206 is formed in the semiconductor substrate 200. The drift region 206 is located in the semiconductor substrate 200, and is usually a lightly doped region. For a LDMOS with an N-trench, the drift region is N-type doped. In an embodiment, the doping concentration of the drift region 206 can range from $10^{15}$ atoms/cm$^3$ to $10^{18}$ atoms/cm$^3$. In addition, the source region (source) 207 is formed in the body region 201, and the drain region (drain) 206 is formed in the drift region 206. A source electrode and a drain electrode can respectively be led out from the source region 207 and the drain region 208. As an example, the source region 207 and the drain region 208 are both N-type doped, and the doping concentrations can be the same. In an embodiment, the N-type doping concentration of the source region 207 and the drain region 208 can range from $10^{18}$ atoms/cm$^3$ to $10^{21}$ atoms/cm$^3$. For example, the doping concentration is configured to $10^{20}$ atoms/cm$^3$.

In an embodiment, the material of the first field oxide 202 is silicon oxide. In an embodiment, the first field oxide 202 has a thickness ranging from 400 Å to 1800 Å.

In an embodiment, the second field oxide 211 has a thickness ranging from 500 Å to 2000 Å, and the second field plate 212 has a thickness ranging from 500 Å to 1500 Å.

In an embodiment, a gate dielectric layer 203 is formed on the semiconductor substrate 200. The gate dielectric layer 203 includes an oxide layer, for example, a silicon dioxide ($SiO_2$) layer having a thickness ranging from 100 Å to 150 Å. As shown in FIG. 2H, one end of the gate dielectric layer 203 covers a portion of the body region 201.

In an embodiment, the gate polycrystalline 204 is formed on the semiconductor substrate 200, and the gate polycrystalline 204 includes a polysilicon. As shown in FIG. 2H, the gate polycrystalline 204 covers the gate dielectric layer 203 and the first field oxide 202, and is used as the first field plate. The first field plate is located above the drift region 206, which improves the electric field at the boundary of the gate polycrystalline, and optimizes the depletion of the drift region 206, thereby increasing the breakdown voltage of the device.

In an embodiment, a salicide block layer 209 is further disposed across the drift region 206 and the gate polycrystalline 204. The salicide block layer 209 completely covers the drift region 206, and an edge of the salicide block layer 209 is adjacent to an edge of the drain region 208. The salicide block (SAB) layer 209 is an oxide layer. The formation of the salicide block layer 209 can increase the distance between the ion implantation at the drain terminal and the gate polycrystalline 204, thereby further increasing the breakdown voltage of the device. In other embodiments, the salicide block layer 209 may not be formed on the drift region 206 and the gate polycrystalline 204.

In an embodiment, a metal silicide 210 is formed on an exposed upper surface of the gate polycrystalline 204, the source region 207, and the drain region 208. The metal of the metal silicide 210 includes cobalt. The purpose of the formation of the metal silicide 210 is to reduce the contact resistance of the device, thereby further reducing the power consumption of the device. In other embodiments, the metal silicide 208 may not be formed.

In an embodiment, the second field oxide 211 is an oxide layer. In this embodiment, a thickness of the second field oxide 211 can be correspondingly configured according to performance requirements of the device. Specifically, the thickness of the second field oxide 211 can be adjusted according to the device properties. For example, the reduction of the thickness of the second field oxide 211 can enhance the depletion of the drift region 206, and the increase of the thickness of the second field oxide 211 can weaken the depletion of the drift region 206. In this embodiment, the second field oxide having an adjustable thickness is formed between the salicide block layer and the subsequently formed second field plate. This avoids the problems that the enhancement of the depletion effect of the second field plate on the underlying drift region is limited due to the fixed thickness of the salicide block layer, the depletion of the drift region by the second field plate cannot be changed by changing the thickness of the second field oxide under the second field plate, and further the device properties show a lower breakdown voltage caused by the too fast depletion or insufficient depletion of the drift region. The thickness of the second field oxide under the second field plate of the present disclosure is adjustable, so that the adjustment to the device properties can be more flexible.

In an embodiment, the second field plate 212 is a metal field plate, and the material thereof includes cobalt. The formation of the second field plate 212 disposed across the drift region 206 and the gate electrode enhances the depletion of the drift region 206 between the drain region 208 and the gate electrode, thereby increasing the breakdown voltage of the device. In other embodiments, the second field plate 212 can be a polycrystalline field plate.

In an embodiment, the semiconductor device further includes an interlayer dielectric layer and a contact hole 213 extending through the interlayer dielectric layer. As shown in FIG. 2H, a contact hole 213 is respectively formed above the source region 207, the drain region 208, and the second field plate 212. The contact holes 213 are filled with metal (for example, copper). The contact hole 213 leads the second field plate 212 to ground.

According to the method of manufacturing the semiconductor device provided by the present disclosure, the first field plate is formed on the first field oxide and located above the drift region, and the second field plate is formed on the second field oxide, so that the two-level field plates enhance the depletion of the drift region while improving the electric field at the gate boundary, thereby increasing the breakdown voltage of the device.

The technical features of the embodiments described above can be arbitrarily combined. In order to simplify the description, all possible combinations of the technical features in the above embodiments have not been exhausted. However, as long as no contradiction in the combination of these technical features exists, they should be considered as falling within the scope described in this specification.

The above-mentioned embodiments only express several implementations of the present disclosure. Although, the descriptions herein are specific and detailed, they should not be understood as a limitation to the scope of the present disclosure. It should be noted that several modifications and improvements, without departing from the concept of the present application, can be made for those skilled in the art, which all belong to the protection scope of the present disclosure. Therefore, the protection scope of the present disclosure shall be subject to the appended claims.

What is claimed is:

1. A method of manufacturing a semiconductor device, comprising the following steps of:
   providing a semiconductor substrate provided with a body region, a gate dielectric layer, and a field oxide layer;
   forming a gate polycrystalline, the gate polycrystalline covering the gate dielectric layer and the field oxide layer, and exposing at least a portion of the field oxide layer;
   forming a drift region in the semiconductor substrate by ion implantation using a drift region masking layer as a mask, removing the exposed portion of the field oxide layer by further using the drift region masking layer as the mask to form a first field oxide self-aligned with the gate polycrystalline, the gate polycrystalline being configured as a first field plate;
   forming a source region in the body region and forming a drain region in the drift region;
   forming a second field oxide on the semiconductor substrate; and
   forming a second field plate on the second field oxide,
   wherein between the step of forming the source region in the body region and forming the drain region in the drift region, and the step of forming the second field oxide on the semiconductor substrate, the method further comprises:
   forming a salicide block layer disposed across the drift region and the gate polycrystalline; and
   forming a metal silicide on an exposed upper surface of the gate polycrystalline, the source region, and the drain region, and
   wherein a coverage of the second field plate is less than or equal to a coverage of the salicide block layer.

2. The method of claim 1, wherein a boundary of a side of the second field plate proximate to the source region is in line with a boundary of a side of the salicide block layer proximate to the source region, and a range of a boundary of a side of the second field plate proximate to the drain region is less than a range of a boundary of a side of the salicide block layer proximate to the drain region.

3. The method of claim 1, wherein the step of forming the second field plate on the second field oxide comprises:
   forming a metal layer covering the second field oxide; and
   forming the second field plate on the second field oxide and above the salicide block layer by lithography and etching.

4. The method of claim 1, wherein the second field plate is located above the gate polycrystalline, or above the drift region, or above the gate polycrystalline and the drift region.

5. A semiconductor device, comprising:
   a semiconductor substrate provided with a body region and a drift region, a source region being located in the body region, and a drain region being located in the drift region;
   a gate dielectric layer located on the semiconductor substrate;
   a first field oxide located on the semiconductor substrate;
   a gate polycrystalline covering the first field oxide and the gate dielectric layer, the gate polycrystalline being configured as a first field plate;
   a second field oxide covering the semiconductor substrate;
   a second field plate located on the second field oxide;
   a salicide block layer disposed across the drift region and the gate polycrystalline; and
   a metal silicide formed on an exposed upper surface of the gate polycrystalline, the source region, and the drain region,
   wherein a coverage of the second field plate is less than or equal to a coverage of the salicide block layer.

6. The semiconductor device of claim 5, wherein the salicide block layer completely covers the drift region.

7. The semiconductor device of claim 5, wherein a boundary of a side of the second field plate proximate to the source region is in line with a boundary of a side of the salicide block layer proximate to the source region, and a range of a boundary of a side of the second field plate proximate to the drain region is less than a range of a boundary of a side of the salicide block layer proximate to the drain region.

8. The semiconductor device of claim 5, wherein the second field plate is located above the gate polycrystalline, or above the drift region, or above the gate polycrystalline and the drift region.

9. The semiconductor device of claim 5, wherein the salicide block layer has a thickness ranging from 300 Å to 2000 Å, the first field oxide has a thickness ranging from 400 Å to 1800 Å, the second field oxide has a thickness ranging from 500 Å to 2000 Å, and the second field plate has a thickness ranging from 500 Å to 1500 Å.

10. The semiconductor device of claim 5, wherein the second field plate comprises a metal field plate.

11. The semiconductor device of claim 5, wherein the gate dielectric layer and the first field oxide are disposed adjacent to each other.

* * * * *